United States Patent
Chen et al.

(10) Patent No.: US 7,355,471 B2
(45) Date of Patent: Apr. 8, 2008

(54) CIRCUIT FOR DC OFFSET CANCELLATION

(75) Inventors: Kuan Da Chen, Taipei (TW); Chunwei Hsu, Taipei (TW)

(73) Assignee: Via Technologies Inc., Taipei (TW)

( * ) Notice: Subject to any disclaimer, the term of this patent is extended or adjusted under 35 U.S.C. 154(b) by 113 days.

(21) Appl. No.: 11/449,710

(22) Filed: Jun. 9, 2006

(65) Prior Publication Data

US 2006/0279344 A1 Dec. 14, 2006

(51) Int. Cl.
*H03F 1/02* (2006.01)

(52) U.S. Cl. .............................. 330/9; 330/99; 330/85; 330/310; 327/307

(58) Field of Classification Search .................. 330/9, 330/99, 85, 310; 327/307
See application file for complete search history.

(56) References Cited

U.S. PATENT DOCUMENTS 6,437,643 B1 * 8/2002 Ueno et al. .................. 330/85
6,459,889 B1 * 10/2002 Ruelke ........................ 455/296
6,483,355 B1 * 11/2002 Lee et al. .................... 327/113
6,516,185 B1 * 2/2003 MacNally ................. 455/234.1
7,257,385 B2 * 8/2007 Ono et al. ................ 455/232.1
7,262,724 B2 * 8/2007 Hughes et al. .............. 341/139

* cited by examiner

*Primary Examiner*—Patricia Nguyen
(74) *Attorney, Agent, or Firm*—Rosenberg, Klein & Lee

(57) ABSTRACT

A circuit having multiple overlapped feedback loops for DC offset cancellation is provided with applying in one of multistage amplifier, multistage filter, and the combination thereof. The circuit includes a plurality of negative feedback variable bandwidth switches coupled to each stage of the above mentioned multistage devices, the output of the last stage is coupled to an input of a low-pass filter loop. The circuit includes a plurality of variable gain amplifiers, output of each variable gain amplifier is coupled to the series contact of each stage respectively, and input of each variable gain amplifier is thereof coupled to an output of the low-pass filter loop. Therefore, the circuit achieves to cancel the DC offset for multistage overlapped feedback path with less area and low power consumption.

14 Claims, 4 Drawing Sheets

CIRCUIT FOR DC OFFSET CANCELLATION

FIELD OF THE INVENTION

The present invention relates to a circuit for DC offset cancellation, and more particularly to a circuit having multiple overlapped feedback loops to cancel the DC offset.

BACKGROUND OF THE INVENTION

Conventional methods of down converting a Radio Frequency (RF) signal to baseband require two conversion steps. The RF signal is first down converted to an intermediate frequency (IF) signal. Then, the IF signal is down converted to a baseband signal. In a mobile telecommunication environment, this requires a radio frequency receiver (RFR) chip, an intermediate frequency receiver (IFR) chip, a baseband receiver chip, and other associated surrounding chips, all of which are expensive for mobile phone manufacturers.

A direct conversion enables the direct conversion of RF signals to baseband signals in a single step. Thus, direct conversion eliminates the need for the RF to IF conversion step, and thus, the IFR chip.

One of the problems associated with direct conversion is that it results in very high direct current (DC) offset levels. These unwanted DC offsets include static DC levels as well as time varying DC levels. The sources of static and time-varying DC offsets include circuit mismatch, LO self-mixing, and interferer self-mixing, each of which may vary with gain setting, frequency, fading, and temperature. If such DC offsets are not cancelled, they degrade signal quality, limit dynamic range through saturation, and increase power consumption.

What is needed is a circuit and method that cancels DC offsets for direct conversion architectures. What is also needed is a circuit and method that acquires and cancels DC offsets in a fast and efficient manner for direct conversion architectures.

There are two main methods for DC offset cancellation in nowadays. One simple and straightforward method to cancel DC offsets is ac-coupling, as shown in FIG. 1. The circuit for DC offset cancellation 10 includes at least an amplifier or a filter 11, wherein input of each amplifier or filter 11 is coupled with an ac capacitor 13 for isolating the DC offset. This method is suitable and cost effective where the signal spectrum does not have so much energy at dc and the ac-coupling does not degrade system performance. However, large off-chip capacitors are required by using this method, and response time is slow.

Another method to cancel DC offsets utilizes a low-pass filter 27 via negative feedback, as shown in FIG. 2. The circuit for DC offset cancellation 20 includes at least an amplifier or a filter 21, wherein each amplifier or filter 21 is coupled with a DC offset cancellation loop which is a negative feedback loop. The DC offset cancellation loop as shown in FIG. 2 includes the low-pass filter 27 to detect the DC offset therein output of each amplifier or filter 21, and cancel the DC offset therein input of each amplifier or filter 21. While using this method in a system having multistage amplifier and filter, each stage is needed to couple with a DC offset cancellation loop including a low-pass filter for canceling the DC offset therein input of multistage amplifier and filter. Therefore, the implementation of low-pass filters for canceling the DC offset causes the larger area and higher power consumption.

SUMMARY OF THE INVENTION

To overcome the drawbacks of the prior art, the present invention provides a circuit having for DC offset cancellation with multiple overlapped feedback loops, reducing the area of circuit and power consumption, and increasing high stability.

To achieve the previous mentioned objects, the present invention provides a circuit for DC offset cancellation, including a multistage amplifier, including a plurality of seriated amplifiers, each stage amplifier received the output signal from the prior amplifier to amplify, and outputting to next stage amplifier; a plurality of variable gain amplifiers, the outputs of the variable gain amplifier coupled to the seriated contact between each stage amplifier of the multistage amplifier; and a low-pass filter, the input thereof coupled to the output of multistage amplifier, and the output thereof coupled to the input of variable gain amplifier.

To achieve the previous mentioned objects, the present invention further provides a circuit for DC offset cancellation, including a multistage filter, including a plurality of seriated filters, each stage filter received the output signal from prior stage filter to filter, and outputting to next stage filter; a plurality of variable gain amplifiers, the output of each of variable gain amplifiers coupled to the seriated contact between each stage filter of multistage filter; and a low-pass filter, the input thereof coupled the output of multistage filter, and the output thereof coupled to the input of each variable gain amplifier.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 2:
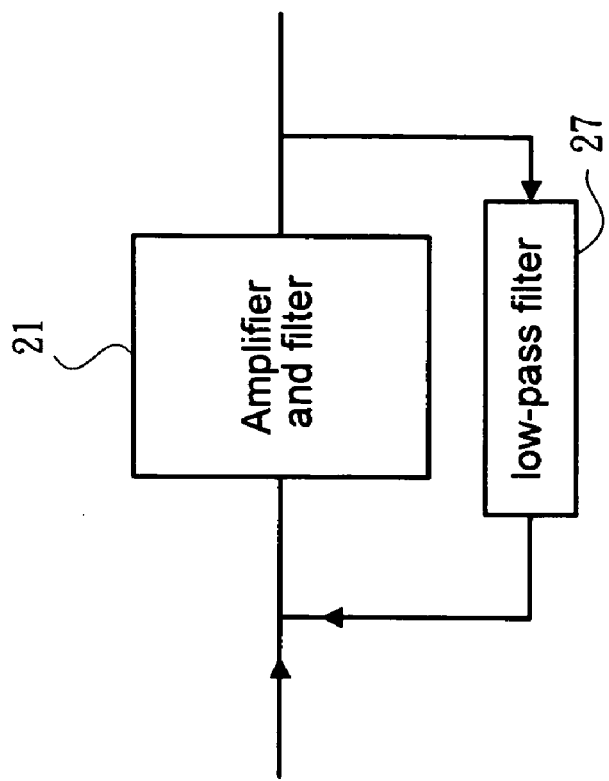
FIG. 2 illustrates a circuit diagram of another prior art for DC offset cancellation with a low-pass filter.
Figure 1:
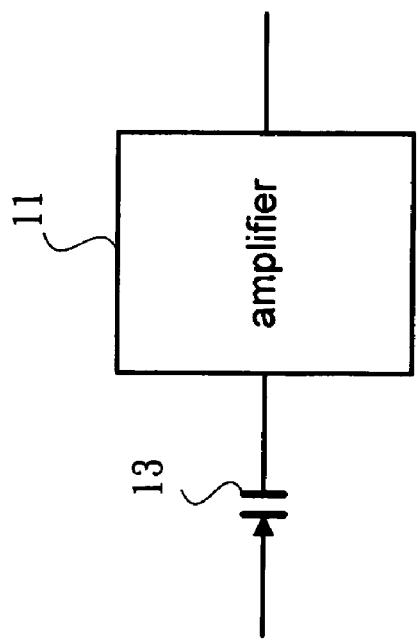
FIG. 1 illustrates a circuit diagram of prior art for DC offset cancellation with an ac capacitor.
Figure 3:
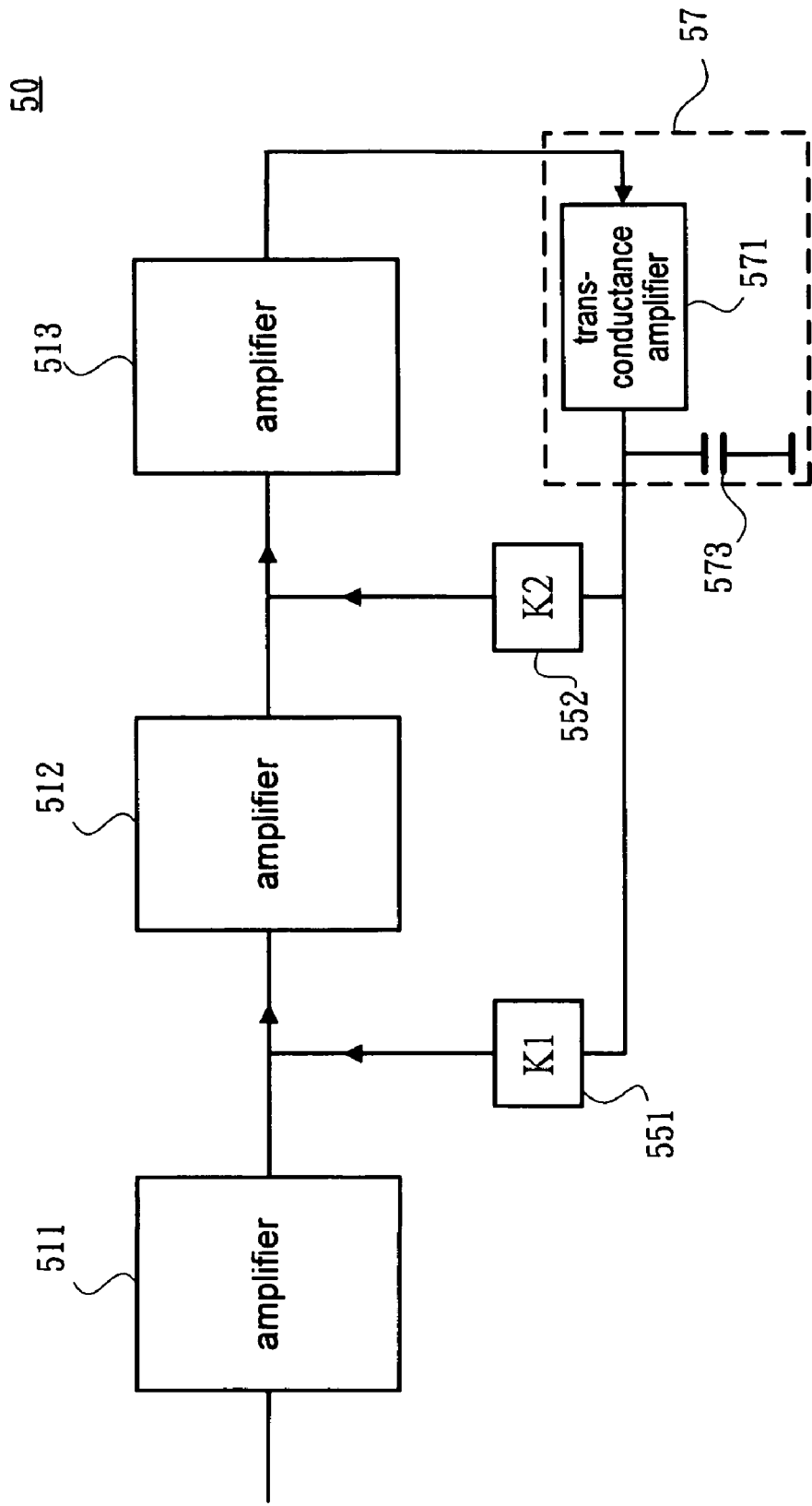
FIG. 3 illustrates a circuit diagram according to one embodiment of the present invention.

The circuit 50 having multiple overlapped feedback loops for DC offset cancellation of the invention includes a plurality of stages of circuit. Referring to FIG. 3, shows a circuit diagram according to one embodiment of the present invention. The circuit 50 includes a first stage amplifier 511, a second stage amplifier 512, and a third stage amplifier 513, for example.

The circuit 50 includes two variable gain amplifiers 551, 552 coupling to input of each amplifier 512 and 513 respectively. The output of the first variable gain amplifier 551 is coupled to the seriated contact between the first stage amplifier 511 and the second stage amplifier 512, the output of the second variable gain amplifier 552 is coupled to the seriated contact between the second stage amplifier 512 and the third stage amplifier 513. Each variable gain amplifier 551, 552 follows the gain change of each stage amplifier 511, 512, and 513, cause of that when the gain is changed from each stage amplifier 511, 512, and 513, the loop bandwidth of the circuit 50 is changed, which affects the loop stability, and further may lose operation of the circuit 50. Therefore, the circuit 50 additionally adjusts the gain of the variable gain amplifier 551, 552 to follow the gain of each stage amplifier 511, 512, and 513 to stabilize the loop operation.

The circuit 50 further includes a low-pass filter 57 and a plurality of variable gain amplifier to form multiple overlapped feedback loops for DC offset cancellation. The low-pass filter 57, for example, includes a transconductance amplifier 571 and a capacitor 573. Input of the transconductance amplifier 571 is coupled to output of the third stage amplifier 513 (the last stage in the embodiment), and output of the transconductance amplifier 571 is coupled to input of each variable gain amplifier 551, 552, wherein the capacitor 573 filters the output noise of the transconductance amplifier 571 to ground.

According to the embodiment of the invention, the transconductance amplifier 571 is implemented by a variable gain transconductance amplifier, which is the same with each variable gain amplifier 551, 552 to modify the gain itself, following the gain of each stage amplifier 511, 512, and 513.

Furthermore, the circuit 50 in the embodiment includes two overlapped feedback loops. One loop is feed back to the amplifier 512 via the low-pass filter 57 and the variable gain amplifier 551. Another loop is feed back to the amplifier 513 via the low-pass filter 57 and the variable gain amplifier 552. The loops are both feed back to the corresponding amplifier 512 and 513 via the low-pass filter 57, therefore these two loops are overlapped with the low-pass filter 57. In addition, the circuit 50 for DC offset cancellation having multiple overlapped feedback loops via the low-pass filter 57 and variable gain amplifier 551, 552 provides more paths to the input of each stage amplifier via negative feedback, and the gains K1 and K2 of the variable gain amplifier 551 and 552 are adjustable, such that causes the more effects for DC offset cancellation.

Figure 4:
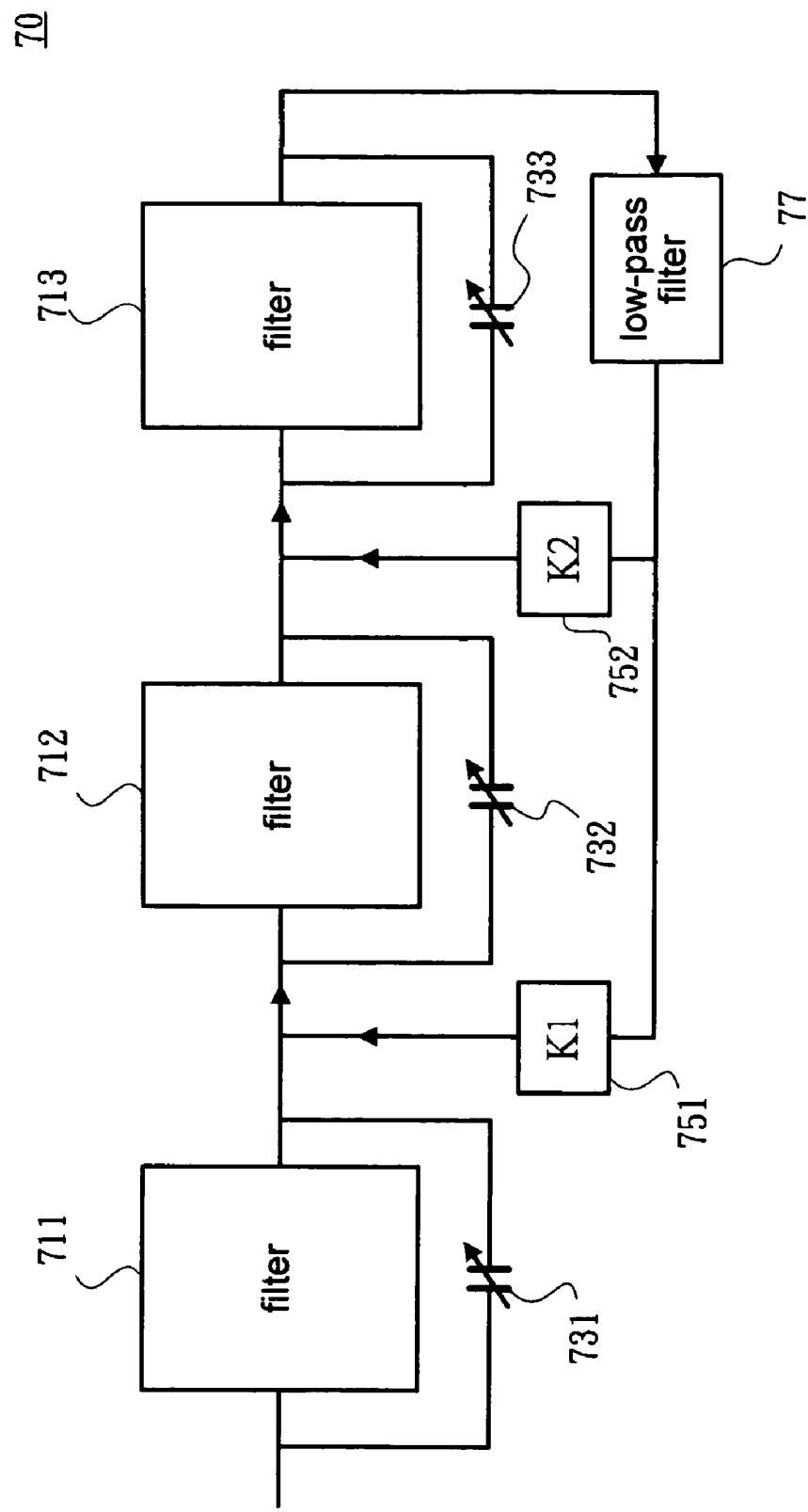
FIG. 4 illustrates a circuit diagram according to another embodiment of the present invention.

Referring to FIG. 4, shows a circuit diagram according to another embodiment of the present invention. The circuit 70 for DC offset cancellation includes a first stage filter 711, a second stage filter 712, and a third stage filter 713, which respectively are coupled to a variable bandwidth switch via negative feedback. The first stage filter 711 is coupled to the first variable bandwidth switch 731 via negative feedback, the second stage filter 712 is coupled to the second bandwidth gain switch 732 via negative feedback, and the third stage filter 713 is coupled to the third variable bandwidth switch 733 via negative feedback. Each variable bandwidth switch is implemented by a variable bandwidth capacitor.

Each variable bandwidth switch 731, 732, and 733 is used to change the bandwidth of each stage filter 711, 712, and 713 of the circuit 70. Due to the filter within the circuit 70 for DC offset cancellation, each stage filter 711, 712, and 713 is with the limitation of bandwidth for limiting the loop bandwidth of the circuit 70, which limits the function of DC offset cancellation for loop circuit. Therefore, the circuit 70 additionally includes variable bandwidth switch 731, 732, 733 to prevent effect of the loop bandwidth of the circuit 70 from the bandwidth of each stage filter 711, 712, and 713 to achieve the DC offset cancellation purpose.

The circuit 70 for DC offset cancellation includes two variable gain amplifier 751, 752, the output of the first variable gain amplifier 751 is coupled to the seriated contact between the first stage amplifier 711 and the second stage amplifier 712, the output of the second variable gain amplifier 752 is coupled to the seriated contact between the second stage amplifier 712 and the third stage amplifier 713.

The circuit 70 for DC offset cancellation further includes a low-pass filter 77, the input thereof is coupled to the output of the third stage filter 713, the output thereof is coupled to the input of each variable gain amplifier 751, 752. Thus, the final output signal of three stage filters 711, 712, and 713 can be obtained.

Further, the circuit 70 for DC offset cancellation can increase the feedback paths of low-pass filter 77 through variable bandwidth switch 731, 732, and 733 and variable gain amplifier 751, 752, which provides more paths to the input of each stage amplifier via negative feedback, such that causes the more effects for DC offset cancellation. In the embodiment, each stage filter of the multistage filter is respectively selected to be one of a fixed bandwidth filter and a variable bandwidth filter.

Figure 5:
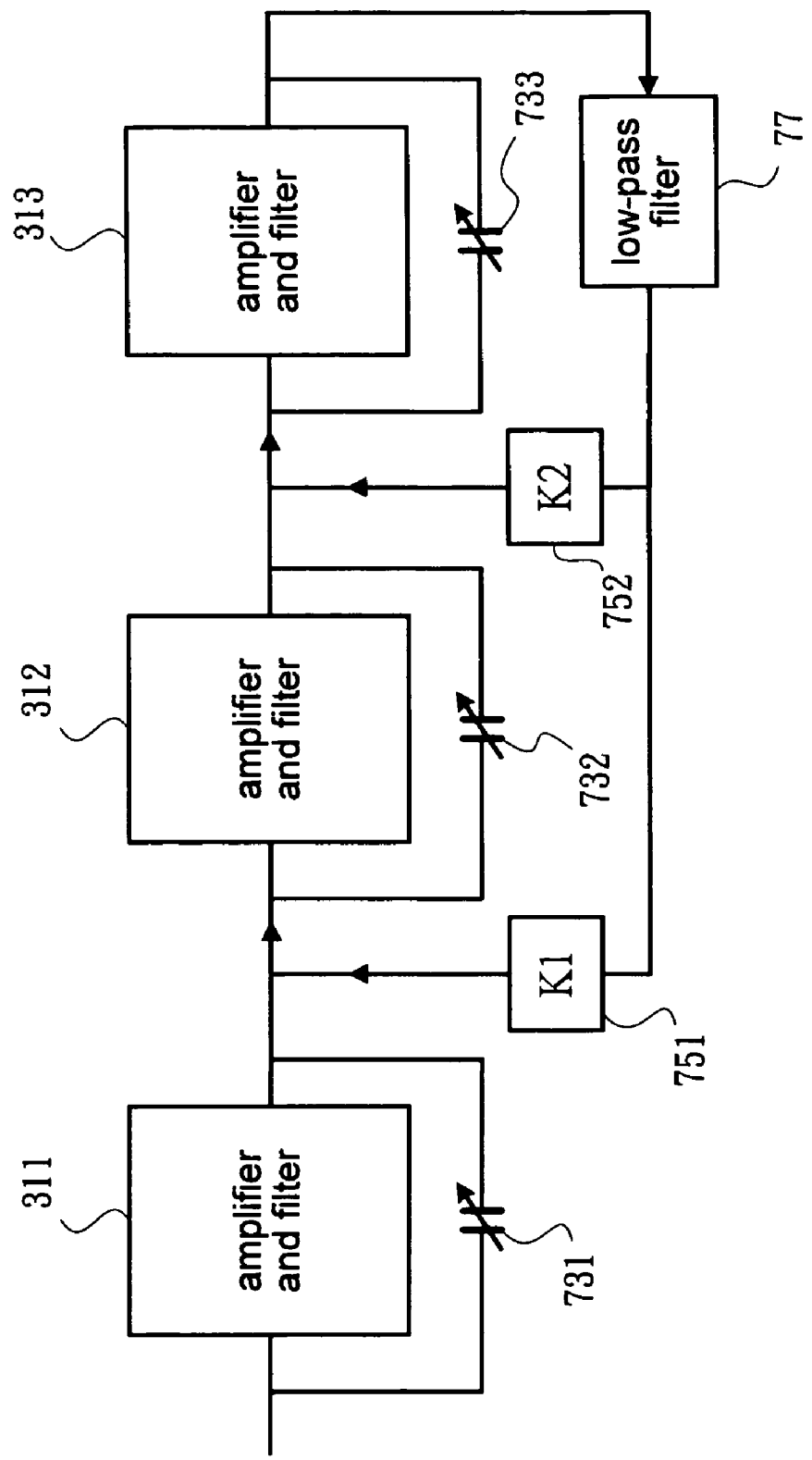
FIG. 5 illustrates a circuit diagram according to another embodiment of the present invention.

Referring to FIG. 5, shows a circuit diagram according to another embodiment of the present invention. According to the combination of foregoing two embodiments, each stage amplifier of the three-stage amplifier 511, 512, and 513 is respectively integrated with a filter to become the first stage integrated with amplifier and filter 311, the second stage integrated with amplifier and filter 312, and the third stage integrated with amplifier and filter 313. The operation thereof is the same with the foregoing two embodiments.

Therefore, a circuit for DC offset cancellation of the invention is provided with low cost and low power, providing high stability and prevents from affecting to cancel DC offset according to the change of circuit gain. The circuit of the invention also provides stable bandwidth and prevents from affecting to cancel DC offset according to limit bandwidth of the circuit for the filter implementation.

The invention has been described in detail with particular reference to certain preferred embodiments thereof, while the person who is skill in the art understands the invention is not limited to three-stage amplifier or three-stage filter, but universally applied in multistage variable gain amplifier, multistage variable bandwidth filter. It will be understood that variations and modifications can be effected within the spirit and scope of the invention.

We claim:

1. A circuit for DC offset cancellation, comprising:
   a multistage amplifier, comprising a plurality of seriated amplifiers, each stage amplifier received the output signal from the prior amplifier to amplify, and outputting to next stage amplifier;
   a plurality of variable gain amplifiers, the outputs of said variable gain amplifier coupled to the seriated contact between each said stage amplifier of said multistage amplifier; and
   a low-pass filter, the input thereof coupled to the output of said multistage amplifier, and the output thereof coupled to the input of said variable gain amplifier.

2. The circuit of claim 1, wherein each said stage amplifier of said multistage amplifier is a variable gain amplifier.

3. The circuit of claim 1, wherein each said stage amplifier of said multistage amplifier further comprises to integrate a filter respectively.

4. The circuit of claim 3, wherein each said filter of said stage amplifier is coupled to a variable bandwidth switch via negative feedback.

5. The circuit of claim 3, wherein each said filter integrated from each said stage amplifier of said multistage amplifier is respectively selected to be one of a fixed bandwidth filter and a variable bandwidth filter.

6. The circuit of claim 1, wherein said low-pass filter comprises:
- a transconductance amplifier, the input thereof coupled to the output of the rear stage amplifier of said multistage amplifier, and output thereof coupled to the input of each said variable gain amplifier; and
- a capacitor, the end thereof coupled with the input of each said variable gain amplifier and the output of said transconductance amplifier, and the other end thereof coupled to ground.

7. The circuit of claim 6, wherein said transconductance amplifier is a variable gain transconductance amplifier.

8. The circuit of claim 4, wherein said variable bandwidth switch is implemented by a variable bandwidth capacitor.

9. A circuit for DC offset cancellation, comprising:
- a multistage filter, comprising a plurality of seriated filters, each said stage filter received the output signal from prior stage filter to filter, and outputting to next stage filter;
- a plurality of variable gain amplifiers, the output of each of said variable gain amplifiers coupled to the seriated contact between each said stage filter of said multistage filter; and
- a low-pass filter, the input thereof coupled the output of said multistage filter, and the output thereof coupled to the input of each said variable gain amplifier.

10. The circuit of claim 9, wherein each said filter of said multistage filter is coupled to a variable bandwidth switch via negative feedback.

11. The circuit of claim 9, wherein each said stage filter of said multistage filter is respectively selected to be one of a fixed bandwidth filter and a variable bandwidth filter.

12. The circuit of claim 10, wherein said variable bandwidth switch is implemented by a variable bandwidth capacitor.

13. The circuit of claim 9, wherein said low-pass filter comprises:
- a transconductance amplifier, the input thereof coupled to the output of the rear stage amplifier of said multistage amplifier, and output thereof coupled to the input of each said variable gain amplifier; and
- a capacitor, the end thereof coupled with the input of said variable gain amplifier and the output of said transconductance amplifier, and the other end thereof coupled to ground.

14. The circuit of claim 13, wherein said transconductance amplifier is a variable gain transconductance amplifier.

* * * * *